United States Patent
Toda et al.

(10) Patent No.: US 8,017,039 B2
(45) Date of Patent: Sep. 13, 2011

(54) FLUORESCENT BODY FOR USE IN A NEAR-ULTRAVIOLET EXCITATION LIGHT-EMITTING ELEMENT

(75) Inventors: Kenji Toda, Niigata (JP); Kazuyoshi Uematsu, Niigata (JP); Mineo Sato, Niigata (JP); Tetsu Umeda, Ushiku (JP); Yutaka Ito, Tsukuba (JP)

(73) Assignees: Niigata University, Niigata (JP); Sumitomo Chemical Company, Limited, Tokyo (JP)

( * ) Notice: Subject to any disclaimer, the term of this patent is extended or adjusted under 35 U.S.C. 154(b) by 0 days.

(21) Appl. No.: 12/933,359

(22) PCT Filed: Mar. 18, 2009

(86) PCT No.: PCT/JP2009/055266
§ 371 (c)(1),
(2), (4) Date: Sep. 17, 2010

(87) PCT Pub. No.: WO2009/116565
PCT Pub. Date: Sep. 24, 2009

(65) Prior Publication Data
US 2011/0012060 A1    Jan. 20, 2011

(30) Foreign Application Priority Data
Mar. 19, 2008 (JP) ................. 2008-071108

(51) Int. Cl.
*C09K 11/08* (2006.01)
*C09K 11/70* (2006.01)
(52) U.S. Cl. ................ 252/301.4 P; 252/301.4 R
(58) Field of Classification Search .......... 252/301.4 P, 252/301.4 R
See application file for complete search history.

(56) References Cited

U.S. PATENT DOCUMENTS

| 2004/0056990 A1 | 3/2004 | Setlur et al. |
| 2005/0068395 A1* | 3/2005 | Haubold et al. ............. 347/100 |

(Continued)

FOREIGN PATENT DOCUMENTS

JP    5-152609 A    6/1993

(Continued)

OTHER PUBLICATIONS

Sbronik Nauchnykh Trudov-Vsesoyuznyi Nauchno-Issledovatel skii Institut Lyuminoforov I Osobo Chistykh Veshchestv, 1983, pp. 66-70, vol. 25 (refer to Chemical Abstracts 102:16552).

*Primary Examiner* — Jerry A Lorengo
*Assistant Examiner* — Lynne Edmondson
(74) *Attorney, Agent, or Firm* — Sughrue Mion, PLLC

(57) ABSTRACT

Provided is a fluorescent body for use in a near-ultraviolet excitation light-emitting element, comprising the compound given by formula (1), having part of element $M^1$ and/or $M^2$ therein replaced by an activation element ($M^3$). $M^1_a M^2_b P_c O_{15}$ (1) (Here, $M^1$ represents one or more elements chosen from the group comprising Ca, Sr, and Ba; $M^2$ represents one or more elements chosen from the group comprising Mg and Zn; a is a number between 1.5 and 2.5, inclusive; b is a number between 2.5 and 3.5, inclusive; and c is a number between 3.5 and 4.5, inclusive.) A fluorescent body in which $M^1$ is Sr and $M^2$ is Mg, and a fluorescent body in which $M^3$ is Eu are preferable. Also provided are a fluorescent paste having the fluorescent body, and a near-ultraviolet excitation light-emitting element having the fluorescent body and having a high luminescent intensity.

5 Claims, 1 Drawing Sheet

U.S. PATENT DOCUMENTS

| | | | |
|---|---|---|---|
| 2007/0295116 A1* | 12/2007 | Le Mercier et al. | 73/866 |
| 2008/0067918 A1 | 3/2008 | Iwasaki et al. | |
| 2008/0265207 A1 | 10/2008 | Konrad et al. | |

FOREIGN PATENT DOCUMENTS

| | | |
|---|---|---|
| JP | 07-099345 A | 4/1995 |
| JP | 10-255671 A | 9/1998 |
| JP | 2004-168996 A | 6/2004 |
| JP | 2005-340748 A | 12/2005 |
| JP | 2007-532724 A | 11/2007 |
| JP | 2008-074890 A | 4/2008 |
| JP | 2008-133390 A | 6/2008 |

* cited by examiner

FLUORESCENT BODY FOR USE IN A NEAR-ULTRAVIOLET EXCITATION LIGHT-EMITTING ELEMENT

CROSS REFERENCE TO RELATED APPLICATIONS

This application is a National Stage of International Application No. PCT/JP2009/055266 filed Mar. 18, 2009, claiming priority based on Japanese Patent Application No. 2008-071108, filed Mar. 19, 2008, the contents of all of which are incorporated herein by reference in their entirety.

TECHNICAL FIELD

The present invention relates to a phosphor for a near-ultraviolet excitation light-emitting element.

BACKGROUND ART

A phosphor for near-ultraviolet excitation light-emitting elements is used in near-ultraviolet excitation light-emitting elements such as white LEDs. Patent Document 1 describes a Eu-activated alkaline earth metal halogen apatite phosphor.
Patent Document 1
JP 2005-340748 A (US2005/0156496 A1)

DISCLOSURE OF THE INVENTION

Problem to be Solved by the Invention

An object of the present invention is to provide a near-ultraviolet excitation light-emitting element having a high luminescence intensity and a new phosphor suitable for the same.

Means for Solving the Problem

As a result of intensive studies, the present inventors have accomplished the present invention.
Thus, the present invention provides the following invention.
<1> A phosphor for a near-ultraviolet excitation light-emitting element represented by the formula (1):

$$M^1_a M^2_b P_c O_{15} \quad (1)$$

wherein $M^1$ represents one or more elements selected from the group consisting of Ca, Sr, and Ba; $M^2$ represents one or more elements selected from the group consisting of Mg and Zn; a is a value in the range of 1.5 to 2.5 (both inclusive); b is a value in the range of 2.5 to 3.5 (both inclusive); and c is a value in the range of 3.5 to 4.5 (both inclusive), and
a part of the element(s) $M^1$ and/or $M^2$ is substituted by an activating element ($M^3$).
<2> The phosphor according to item <1> above, wherein $M^1$ is Sr and $M^2$ is Mg.
<3> The phosphor according to item <1> or <2> above, wherein $M^3$ is Eu.
<4> A phosphor paste comprising the phosphor according to any one of items <1> to <3> above.
<5> A near-ultraviolet excitation light-emitting element comprising the phosphor according to any one of items <1> to <3> above.

ADVANTAGES OF THE INVENTION

According to the present invention, a near-ultraviolet excitation light-emitting element having a high luminescence intensity and a phosphor suitable for the same can be provided, and thus the present invention is industrially useful.

BEST MODE FOR CARRYING OUT THE INVENTION

Figure 1:
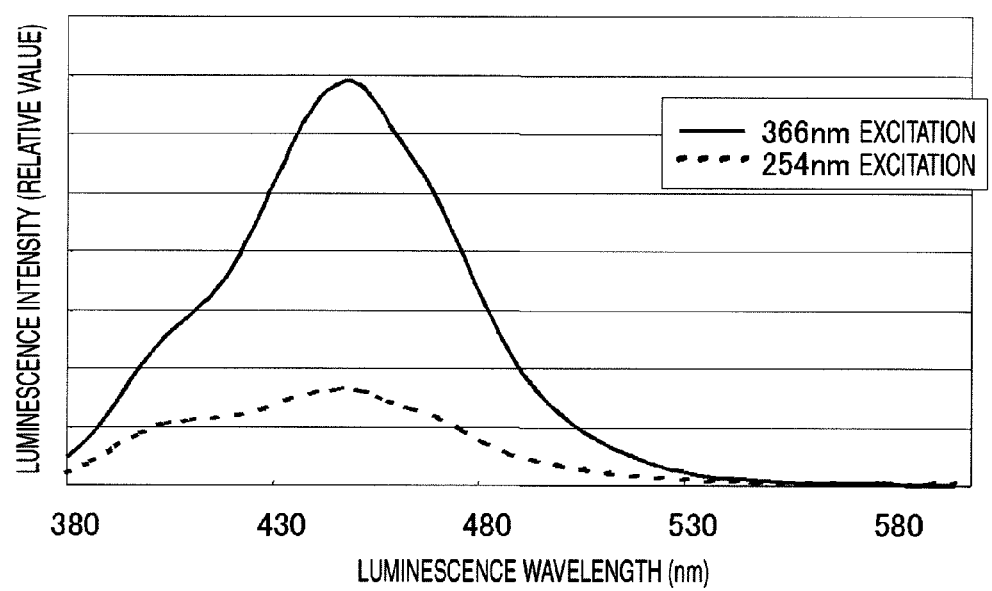
FIG. 1 shows luminescence emission spectra in Example 1 and Reference Example 1. (The horizontal axis represents the wavelength of luminescence and the vertical axis represents a luminescence intensity (arbitrary unit).)

The present invention will be described below in detail.
The phosphor for a near-ultraviolet excitation light-emitting element of the present invention is characterized by being obtained by substituting a part of the element(s) $M^1$ and/or $M^2$ in a compound represented by the formula (1) with an activating element ($M^3$).

$$M^1_a M^2_b P_c O_{15} \quad (1)$$

(wherein $M^1$ represents one or more elements selected from the group consisting of Ca, Sr, and Ba; $M^2$ represents one or more elements selected from the group consisting of Mg and Zn; a is a value in the range of 1.5 to 2.5 (both inclusive); b is a value in the range of 2.5 to 3.5 (both inclusive); and c is a value in the range of 3.5 to 4.5 (both inclusive))
According to the present invention, the phosphor emits light by being excited by near-ultraviolet light. Here, the near-ultraviolet light means light having a wavelength of 300 nm to 400 nm.
According to the present invention, $M^1$ preferably comprise at least Sr and more preferably, $M^1$ is Sr in view of the crystallinity of the phosphor.
According to the present invention, $M^2$ preferably compries at least Mg and more preferably, $M^2$ is Mg in view of the crystallinity of the phosphor.
According to the present invention, the activating element ($M^3$) may be any element provided that it causes the phosphor to emit light. The activating element used may be properly selected from rare earth elements and Mn. In view of crystallinity, $M^3$ is preferably selected so that the ionic radius may be close to the ionic radius of the element constituting $M^1$ and/or $M^2$; preferred combinations may include Eu ($M^3$)/Sr ($M^1$) and Mn ($M^3$)/Mg ($M^2$). $M^3$ is preferably Eu in view of increasing the luminescence intensity of the phosphor. Here, a part of $M^3$ used may be substituted by a coactivator element. Examples of the coactivator element may include Al, Y, La, Gd, Pr, Nd, Sm, Dy, Ho, Er, and Bi.
According to the present invention, when a part of $M^1$ is substituted by $M^3$ or when a part of $M^2$ is substituted by $M^3$, a percentage of substitution with $M^3$ typically is in the range of 0.001% to 50% by mole (both inclusive), preferably 0.001% to 10% by mole (both inclusive), more preferably 0.1% to 7% by mole (both inclusive) based on the total molar amount of $M^1$ and $M^3$ or the total molar amount of $M^2$ and $M^3$. When a part of $M^1$ and $M^2$ is substituted by $M^3$, a percentage of substitution with $M^3$ typically is in the range of 0.001% to 50% by mole (both inclusive), preferably 0.01% to 20% by mole (both inclusive) based on the total molar amount of $M^1$, $M^2$, and $M^3$. Such a percentage of substitution with $M^3$ can increase luminescence intensity. A part of $M^1$ is preferably substituted by $M^3$. When a part of $M^3$ is substituted by a coactivator element, the molar amount of $M^3$ in the above description means the total molar amount of $M^3$ and the coactivator element. The percentage of substitution of $M^3$ with the coactivator element is not particularly limited; however, it is typically in the range of 0.01% to 10% by mole (both inclusive) based on the molar amount of $M^3$.

According to the present invention, when Eu is used as $M^3$, the phosphor is preferably represented by the following formula (2):

$$M^1_{a(1-x)}Eu_{ax}M^2_bP_cO_{15} \quad (2)$$

wherein $M^1$, $M^2$, a, b, and c have the same meanings as described above; and x is a value in the range of 0.00001 to 0.5 (both inclusive).

In the formula (2), x is preferably in the range of 0.00001 to 0.1 (both inclusive).

A method for producing the phosphor of the present invention will now be described.

The phosphor of the present invention may be produced, for example, as follows. The phosphor of the present invention may be produced by firing a metal compound mixture having a composition capable of forming the phosphor of the present invention by the firing.

Specifically, it may be produced by weighing and mixing compounds containing corresponding metal elements so as to provide a predetermined composition and then firing the resultant metal compound mixture.

More specifically, it may be produced by weighing and mixing the raw materials of a compound containing $M^1$, a compound containing $M^2$, a compound containing $M^3$, a compound containing P, and, if desired, a compound containing a coactivator element so as to provide a predetermined composition and then firing the resultant metal compound mixture.

Among the compounds containing metal elements, the compound containing $M^1$, the compound containing $M^2$, compound containing $M^3$, and compound containing a coactivating element which may be used is, for example, oxides or those capable of being converted into oxides by decomposition and/or oxidation at high temperature, such as hydroxides, carbonates, nitrates, halides, oxalates, and phosphates. The compound containing P which may be used is $H_3PO_4$ or $(NH_4)_2HPO_4$.

For example, a phosphor having a Ba:Mg:P:Eu molar ratio of 1.99:3:4:0.01 (theoretical composition ratio) as one of the preferable phosphors according to the present invention may be produced by weighing and mixing $BaCO_3$, MgO, $(NH_4)_2HPO_4$, and $Eu_2O_3$ so as to provide a Ba:Mg:P:Eu molar ratio of 1.99:3:4:0.01 and firing the resultant metal compound mixture.

For the above mixing, an apparatus typically used industrially, such as a ball mill, a V-shaped mixer, and a stirrer, may be used, for example. At this time, the mixing may be carried out by dry mixing or wet mixing.

Furthermore, it may be carried out through a step of crystallization.

The metal compound mixture may be placed in a firing container as needed and held typically in the range of 900° C. to 1,100° C., particularly in the range of 950° C. to 1,050° C. in view of increasing crystallinity typically for 0.5 hour to 100 hours (both inclusive), particularly for 1 hour to 6 hours (both inclusive) for firing to provide the phosphor of the present invention.

Atmospheres for firing include, for example, inert gas atmospheres such as nitrogen and argon; oxidizing atmospheres such as air, oxygen, oxygen-containing nitrogen, and oxygen-containing argon; and reducing atmospheres such as nitrogen containing 0.1 to 10% by volume of hydrogen and argon containing 0.1 to 10% by volume of hydrogen. When the metal compound mixture is fired in a strongly reducing atmosphere, a technique may be freely used which involves firing by allowing the mixture to contain an adequate quantity of carbon, or the like.

When a compound capable of being decomposed and/or oxidized at high temperature, such as a hydroxide, a carbonate, a nitrate, a halide, and an oxalate is used in the metal compound mixture, the mixture may be held and calcined at a lower temperature than the firing temperature to form an oxide or to remove water of crystallization, followed by performing the firing. The atmosphere for calcination may be an inert gas atmosphere, an oxidizing atmosphere, or a reducing atmosphere. The mixture may also be pulverized after calcination.

As the firing container, a container of a material having lower reactivity with the metal compound mixture at the above-described temperatures and atmospheres may be properly selected. Examples of the container may include an alumina container, a magnesia container, a zirconia container, a mullite container, a Au container, and a Pt container. In view of preventing the sublimation of P during firing, an alumina, magnesia, zirconia, mullite, Au, or Pt lid may also be used with the container.

An adequate quantity of a halide such as a fluoride and a chloride may be used as the above-described compound containing a metal element to control the crystallinity of the resulting phosphor and the average particle size of the particles constituting the phosphor. Here, the halide may serve as a reaction accelerator (flux). Examples of the flux may include halides such as LiF, NaF, KF, LiCl, NaCl, KCl, $MgF_2$, $CaF_2$, $SrF_2$, $BaF_2$, $MgCl_2$, $CaCl_2$, $SrCl_2$, $BaCl_2$, $MgI_2$, $CaI_2$, $SrI_2$, and $BaI_2$; carbonates such as $Li_2CO_3$, $Na_2CO_3$, $K_2CO_3$, and $NaHCO_3$; ammonium salts such as $NH_4Cl$ and $NH_4I$; boron compounds such as $B_2O_3$ and $H_3BO_3$; and phosphate compounds such as $H_3PO_4$ and $(NH_4)_2HPO_4$, and these compounds may be used as raw materials for the metal compound mixture or by adding adequate quantities of the compound to the metal compound mixture.

The phosphor obtained by the above method may be pulverized using a ball mill, a jet mill, or the like; the pulverization and firing may be repeated two or more times. The resultant phosphor may also be washed or classified as needed. The composition of the elements constituting the phosphor can be measured using a GD-MS analyzer or the like.

The particles constituting the phosphor may be subjected to surface treatment such as coating with a surface-modifying material. Examples of the surface-modifying material may include an inorganic substance containing Si, Al, Ti, Y, La, or the like.

The phosphor obtained as described above can exhibit a high luminescence intensity by near-ultraviolet excitation.

The phosphor paste having the phosphor of the present invention will now be described.

The phosphor paste of the present invention comprises the phosphor the present invention and an organic substance as the main components; examples of the organic substance include a solvent and a binder. The phosphor paste of the present invention can be used in the same way as for a phosphor paste used in the production of a conventional light-emitting element. The phosphor paste may be subjected to film formation by coating or the like and then heat treated to remove the organic substance in the phosphor paste by volatilization, burning, decomposition, or the like to provide a phosphor layer consisting substantially of the phosphor of the present invention.

The phosphor paste of the present invention can be produced by a well-known method as disclosed in JP 10-255671

A; for example, it can be obtained by mixing the phosphor of the present invention, a binder, and a solvent using a ball mill, a three-roll mill, or the like. The mixing ratio is not particularly limited, and set properly. According to the present invention, the phosphor paste may also comprise a phosphor other than the phosphor of the present invention.

Examples of the binder include a cellulose resin (ethylcellulose, methylcellulose, nitrocellulose, acetylcellulose, cellulose propionate, hydroxypropylcellulose, butylcellulose, benzylcellulose, a modified cellulose, or the like), an acrylic resin (a polymer of at least one of monomers such as acrylic acid, methacrylic acid, methyl acrylate, methyl methacrylate, ethyl acrylate, ethyl methacrylate, propyl acrylate, propyl methacrylate, isopropyl acrylate, isopropyl methacrylate, n-butyl acrylate, n-butyl methacrylate, tert-butyl acrylate, tert-butyl methacrylate, 2-hydroxyethyl acrylate, 2-hydroxyethyl methacrylate, 2-hydroxypropyl acrylate, 2-hydroxypropyl methacrylate, benzyl acrylate, benzyl methacrylate, phenoxy acrylate, phenoxy methacrylate, isobornyl acrylate, isobornyl methacrylate, glycidyl methacrylate, styrene, α-methylstyrene acrylamide, methacrylamide, acrylonitril, and methacrylonitrile), ethylene-vinyl acetate copolymer resin, polyvinyl butyral, polyvinyl alcohol, propylene glycol, polyethylene oxide, a urethane resin, a melamine resin, and phenol resin.

Examples of the solvent include monohydric alcohols having a high boiling point; polyhydric alcohols such as a diol and a triol, typified by ethylene glycol and glycerin; and etherified and/or esterified alcohols (ethylene glycol monoalkyl ethers, ethylene glycol dialkyl ethers, ethylene glycol alkyl ether acetates, diethylene glycol monoalkyl ether acetates, diethylene glycol dialkyl ethers, propylene glycol monoalkyl ethers, propylene glycol dialkyl ethers, and propylene glycol alkyl acetates).

The phosphor paste obtained as described above is applied onto an object to be coated, and the applied paste is then heat treated to provide a phosphor layer. This phosphor layer also has a high luminescence intensity as is the case with the phosphor. Examples of the object to be coated may include glass and resin; its shape may be plate-like, spherical, massive, or container-like, or may further be flexible. Any of various printing methods may be used as a coating method. The temperature for the heat treatment is typically 300° C. to 600° C. After coating the object to be coated, the paste may be dried at a temperature of room temperature to 300° C. before the heat treatment.

The light-emitting element of the present invention has the above phosphor. The light-emitting element has the phosphor of the present invention and an excitation source (wherein the excitation source emits near-ultraviolet light) and, if desired, has another phosphor.

A method for producing a near-ultraviolet excitation light-emitting element having the phosphor of the present invention will now be described with reference to white LEDs as the light-emitting element. As methods for producing white LEDs, well-known methods as disclosed in JP 05-152609 A, JP 07-99345 A, and the like can be used. Specifically, the phosphor of the present invention may be dispersed in a translucent resin such as epoxy resin, polycarbonate, and silicon rubber, which is then molded so that it may surround near-ultraviolet LEDs to produce white LEDs. When the phosphor of the present invention is a blue phosphor, well-known red and green phosphors may be dispersed together with the blue phosphor of the present invention in the resin. Examples of the red phosphor may include (Y, La, Gd, Lu)$_2$O$_2$S:Eu; examples of the green phosphor may include BaMgAl$_{10}$O$_{17}$:Eu, Mn.

White LEDs can also be produced without dispersing the phosphor in the translucent resin. Specifically, the translucent resin (wherein the translucent resin contains no phosphor) may also be molded so that it may surround near-ultraviolet LEDs, followed by forming a phosphor layer on the surface thereof to produce white LEDs. At this time, the surface of the phosphor layer may also be further covered with the translucent resin. The phosphor layer may be formed, for example, by using the phosphor paste to apply it onto the surface of a translucent resin.

EXAMPLES

The present invention will now be described in further detail with reference to Examples.

Production Example

Strontium carbonate (from Kanto Chemical Co., Inc.), europium oxide (from Shin-Etsu Chemical Co., Ltd.), magnesium carbonate (from Kanto Chemical Co., Inc.), and diammonium hydrogen phosphate (from Kanto Chemical Co., Inc.) were weighed and mixed so that the molar ratio of Sr:Eu:Mg:P may satisfy 1.9:0.1:3:4 to provide a metal compound mixture. The mixture was held at 1,000° C. for 1 hour in an atmosphere of N$_2$ containing 2% by volume of H$_2$ for the firing to provide a phosphor 1 (Sr$_{1.9}$Eu$_{0.1}$Mg$_3$P$_4$O$_{15}$).

Example 1

The phosphor 1 obtained in Production Example emitted blue light when irradiated with near-ultraviolet light of 366 nm in the air. When the luminescence intensity was measured using a spectrophotofluorometer (FP6500 from JASCO Corporation), the luminescence intensity was found to be extremely strong. The luminescence emission spectrum (relationship between luminescence wavelength and luminescence intensity) obtained using the spectrophotofluorometer was shown in FIG. 1.

Reference Example 1

The phosphor 1 obtained in Production Example emitted blue light when irradiated with ultraviolet light of 254 nm in the air. When the luminescence intensity was measured using a spectrophotofluorometer (FP6500 from JASCO Corporation), the luminescence intensity was found to be low. The luminescence emission spectrum (relationship between luminescence wavelength and luminescence intensity) obtained using the spectrophotofluorometer was shown in FIG. 1.

INDUSTRIAL APPLICABILITY

According to the present invention, a near-ultraviolet excitation light-emitting element having a high luminescence intensity and a new phosphor suitable for the same can be provided, and thus the present invention is industrially useful.

The invention claimed is:
1. A phosphor for a near-ultraviolet excitation light-emitting element represented by the formula (1):

$$M^1{}_aM^2{}_bP_cO_{15} \qquad (1)$$

wherein $M^1$ represents one or more elements selected from the group consisting of Ca, Sr, and Ba; $M^2$ represents one or more elements selected from the group consisting of Mg and Zn; a is a value in the range of 1.5 to 2.5 (both inclusive); b is a value in the range of 2.5 to 3.5 (both inclusive); and c is a value in the range of 3.5 to 4.5 (both inclusive), and a part of the element(s) $M^1$ and/or $M^2$ is substituted by an activating element ($M^3$).

2. The phosphor according to claim 1, wherein $M^1$ is Sr and $M^2$ is Mg.

3. The phosphor according to claim 1, wherein $M^3$ is Eu.

4. A phosphor paste comprising the phosphor according to claim 1.

5. A near-ultraviolet excitation light-emitting element comprising the phosphor according to claim 1.

* * * * *